US012610682B2

(12) United States Patent
Xu et al.

(10) Patent No.: US 12,610,682 B2
(45) Date of Patent: Apr. 21, 2026

(54) SOLAR CELL AND MANUFACTURING METHOD THEREOF, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Menglei Xu, Haining (CN); Bairu Li, Haining (CN); Jie Yang, Haining (CN); Xinyu Zhang, Haining (CN)

(73) Assignees: ZHEJIANG JINKO SOLAR CO., LTD., Haining (CN); JINKO SOLAR CO., LTD., Shangrao (CN)

( * ) Notice: Subject to any disclaimer, the term of this patent is extended or adjusted under 35 U.S.C. 154(b) by 0 days.

(21) Appl. No.: 18/359,863

(22) Filed: Jul. 26, 2023

(65) Prior Publication Data

US 2024/0074220 A1 Feb. 29, 2024

(30) Foreign Application Priority Data

Aug. 29, 2022 (CN) .......................... 202211043561.0
Aug. 29, 2022 (CN) .......................... 202222291255.0

(51) Int. Cl.
*H10K 39/18* (2026.01)
*H10K 39/00* (2023.01)
*H10K 39/15* (2026.01)

(52) U.S. Cl.
CPC ............. *H10K 39/18* (2023.02); *H10K 39/15* (2023.02); *H10K 39/401* (2023.02)

(58) Field of Classification Search
CPC ........ H10K 30/40; H10K 30/57; H10K 30/83; H10K 30/85; H10K 30/86; H10K 39/15; H10K 39/18; H10K 39/401; H10K 85/50
See application file for complete search history.

(56) References Cited

U.S. PATENT DOCUMENTS

2018/0019358 A1 1/2018 Ahn
2019/0334048 A1* 10/2019 Omelchenko .......... H10K 30/87

FOREIGN PATENT DOCUMENTS

CN 109980021 A 7/2019
CN 110165061 A 8/2019
(Continued)

OTHER PUBLICATIONS

Zhang et al., "Highly conductive and transparent silver grid/metal oxide hybrid electrodes for low-temperature planar perovskite solar cells"—Supplementary Data accessed from https://ars.els-cdn.com/content/image/1-s2.0-S0378775316315105-mmc1.docx, Accessed on Dec. 11, 2024.*

(Continued)

*Primary Examiner* — Golam Mowla
(74) *Attorney, Agent, or Firm* — Wiersch Law Group

(57) ABSTRACT

Provided are a solar cell and a manufacturing method thereof, and a photovoltaic module. The solar cell includes: a bottom cell, a perovskite top cell, an inter layer between the bottom cell and the perovskite top cell, and a back electrode located on a back surface of the bottom cell. The perovskite top cell includes a hole transport layer, a perovskite layer, an electron transport layer, and a conductive structure stacked sequentially. The conductive structure includes at least one stack each including a first conductive layer and a second conductive layer located between the first conductive layer and the electron transport layer. The first conductive layer includes a first transparent conductive film. The second conductive layer includes a metal conductive film in a metallization region and a second transparent conductive film in a non-metallization region.

13 Claims, 7 Drawing Sheets

(56)          References Cited

FOREIGN PATENT DOCUMENTS

| CN | 111430494 A | 7/2020 |
| CN | 113421822 A | 9/2021 |
| CN | 215418206 U | 1/2022 |
| CN | 218351478 U | 1/2023 |

OTHER PUBLICATIONS

European Search Report issued in corresponding EP Application EP23188667.2, issued Jan. 25, 2024, 10 pages.
Christoph-Messmer-Optimized-front-TCO-and-metal-grid-electrode-for-module-integrated-perovskite-silicon-tandem-solar-cells.
Highly-conductive-and-transparent-silver-gridmetal-oxide-hybrid.
Patent Search Report; Date of Mailing: Apr. 19, 2022(12 pages).
Chinese Office Action mailed Dec. 30, 2025, issued in related Chinese Application No. 202211043561.0, 20 pages.

* cited by examiner

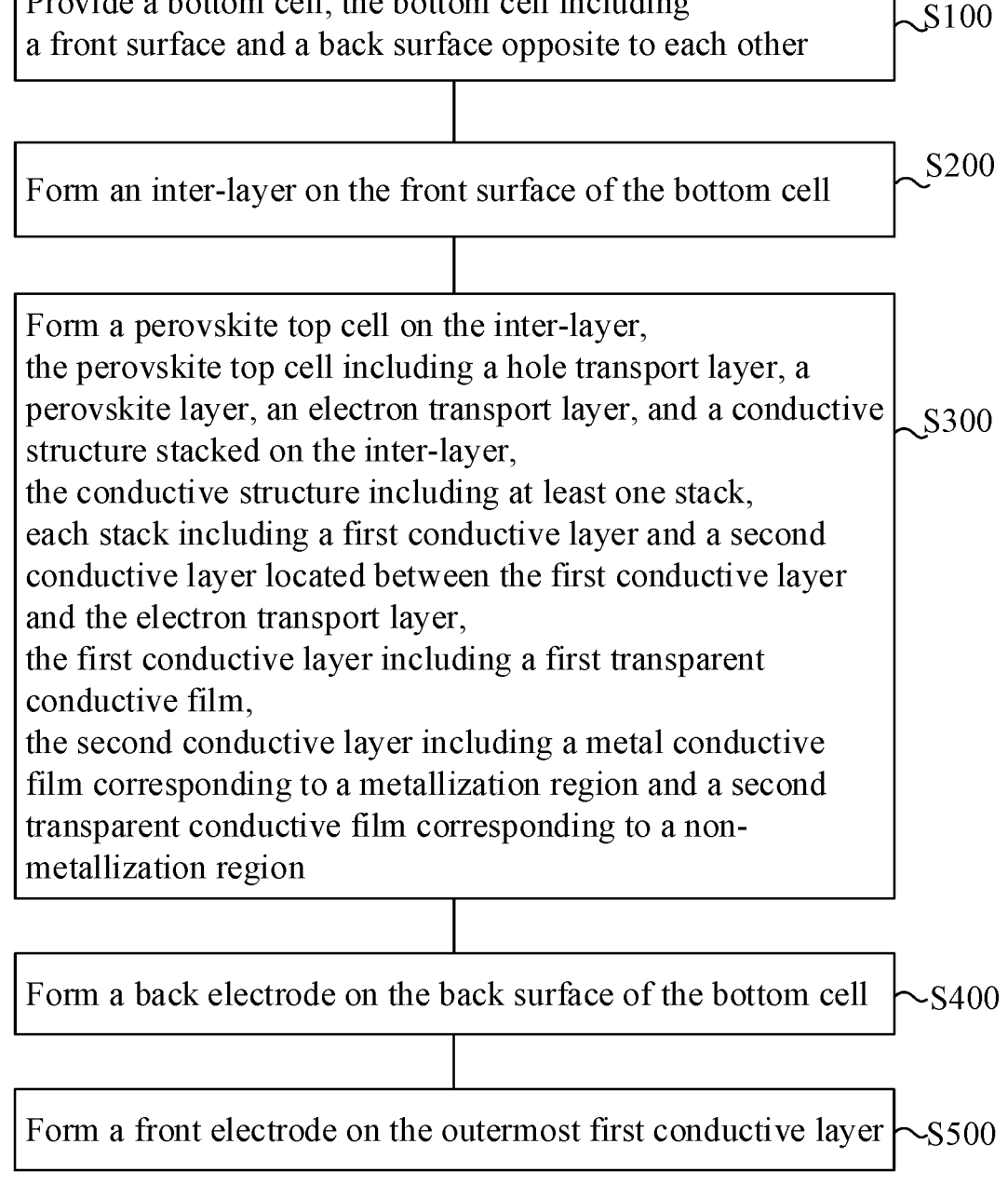

Provide a bottom cell, the bottom cell including
a front surface and a back surface opposite to each other ~S100

Form an inter-layer on the front surface of the bottom cell ~S200

Form a perovskite top cell on the inter-layer,
the perovskite top cell including a hole transport layer, a
perovskite layer, an electron transport layer, and a conductive
structure stacked on the inter-layer,
the conductive structure including at least one stack,
each stack including a first conductive layer and a second
conductive layer located between the first conductive layer
and the electron transport layer,
the first conductive layer including a first transparent
conductive film,
the second conductive layer including a metal conductive
film corresponding to a metallization region and a second
transparent conductive film corresponding to a non-
metallization region ~S300

Form a back electrode on the back surface of the bottom cell ~S400

Form a front electrode on the outermost first conductive layer ~S500

FIG. 3

SOLAR CELL AND MANUFACTURING METHOD THEREOF, AND PHOTOVOLTAIC MODULE

CROSS-REFERENCE TO RELATED APPLICATIONS

The present application claims priority to Chinese Patent Application No. 202211043561.0, filed on Aug. 29, 2022 and to Chinese Patent Application No. 202222291255.0, filed on Aug. 29, 2022, the contents of which are incorporated herein by reference in their entirety.

TECHNICAL FIELD

The present disclosure relates to the technical field of photovoltaic cells, and in particular, to a solar cell and a manufacturing method thereof, and a photovoltaic module.

BACKGROUND

With the gradual aggravation of energy crisis and environmental pollution, human's demand for renewable energy is increasing. Solar energy has advantages of safety, pollution-free, and not being limited by geographical conditions, and is the most widely used and most promising renewable energy. In various technologies for effectively utilizing the solar energy, photovoltaic power generation is undoubtedly one of the most promising directions. Perovskite solar cell has advantages of high efficiency, solution preparation, low cost, and the like. The photoelectric conversion efficiency of the perovskite solar cell is close to that of a silicon-based solar cell. With the in-depth research on the silicon-based solar cell, photoelectric conversion efficiency of the silicon-based solar cell is close to maximum theoretical efficiency. Therefore, improving the photoelectric conversion efficiency of the solar cell has become the key to the development of this field.

A tandem cell technology is one of the most effective ways to improve the photoelectric conversion efficiency of the solar cell. The perovskite material have very strong absorption in a visible light region of 350 nm to 700 nm, while silicon absorbs near-infrared light of 700 nm to 1100 nm, so a silicon-perovskite tandem solar cell composed of a perovskite cell and a silicon cell has been more and more researched, and has achieved higher efficiency than a monocrystalline silicon cell or a perovskite cell. However, due to poor conductivity of an existing silicon-perovskite tandem solar cell, improvement of the solar-energy efficiency of the solar cell is restricted.

Therefore, it is expected to further improve the conductivity of the silicon-perovskite tandem solar cell to improve the photoelectric conversion efficiency of the solar cell.

SUMMARY

In view of the above, embodiments of the present disclosure provide a solar cell and a manufacturing method thereof, and a photovoltaic module. The solar cell has an improved conversion efficiency and reduced manufacturing cost.

In one aspect, embodiments of the present disclosure provide a solar cell. The solar cell includes: a bottom cell including a front surface and a back surface opposite to each other, an inter layer located on the front surface of the bottom cell, a perovskite top cell located on the inter layer, and a back electrode located on the back surface of the bottom cell.

The perovskite top cell includes a hole transport layer, a perovskite layer, an electron transport layer, and a conductive structure stacked on a surface of the inter layer. The conductive structure includes at least one stack, each stack includes a first conductive layer and a second conductive layer stacked with the first conductive layer, and the second conductive layer is located between the first conductive layer and the electron transport layer. The first conductive layer includes a first transparent conductive film, and the second conductive layer includes a metal conductive film in a metallization region and a second transparent conductive film in a non-metallization region.

In another aspect, embodiments of the present disclosure provide a method for manufacturing a solar cell. The manufacturing method including the following steps:

providing a bottom cell, the bottom cell including a front surface and a back surface opposite to each other;

forming an inter layer and a perovskite top cell on the front surface of the bottom cell, the perovskite top cell including a hole transport layer, a perovskite layer, an electron transport layer, and a conductive structure stacked on a surface of the inter layer, where the conductive structure includes at least one stack, each stack includes a first conductive layer and a second conductive layer stacked with the first conductive layer, the second conductive layer is located between the first conductive layer and the electron transport layer, the first conductive layer includes a first transparent conductive film, and the second conductive layer includes a metal conductive film in a metallization region and a second transparent conductive film in a non-metallization region; and forming a back electrode on the back surface of the bottom cell.

In yet another aspect, embodiments of the present disclosure provide a photovoltaic module. The photovoltaic module includes a plurality of solar cell strings, and each of the solar cell strings includes a plurality of solar cells electrically connected to one another. At least one solar cell each includes: a bottom cell including a front surface and a back surface opposite to each other, an inter layer located on the front surface of the bottom cell, a perovskite top cell located on the inter layer, and a back electrode located on the back surface of the bottom cell.

The perovskite top cell includes: a hole transport layer, a perovskite layer, an electron transport layer, and a conductive structure stacked on a surface of the inter layer. The conductive structure includes at least one stack, each stack includes a first conductive layer and a second conductive layer stacked with the first conductive layer, and the second conductive layer is located between the first conductive layer and the electron transport layer. The first conductive layer includes a first transparent conductive film, and the second conductive layer includes a metal conductive film in a metallization region and a second transparent conductive film in a non-metallization region.

BRIEF DESCRIPTION OF DRAWINGS

In order to more clearly illustrate the technical solutions in embodiments of the present disclosure, the accompanying drawings required to be used in the description of the embodiments or the related art will be briefly introduced below. It is apparent that, the accompanying drawings in the following description are only some embodiments of the present disclosure, and other drawings can be obtained by those of ordinary skill in the art from the provided drawings without creative efforts.

FIG. 3 is a flowchart of a method for manufacturing a solar cell according to one or more embodiments of the present disclosure;

Figure 1:
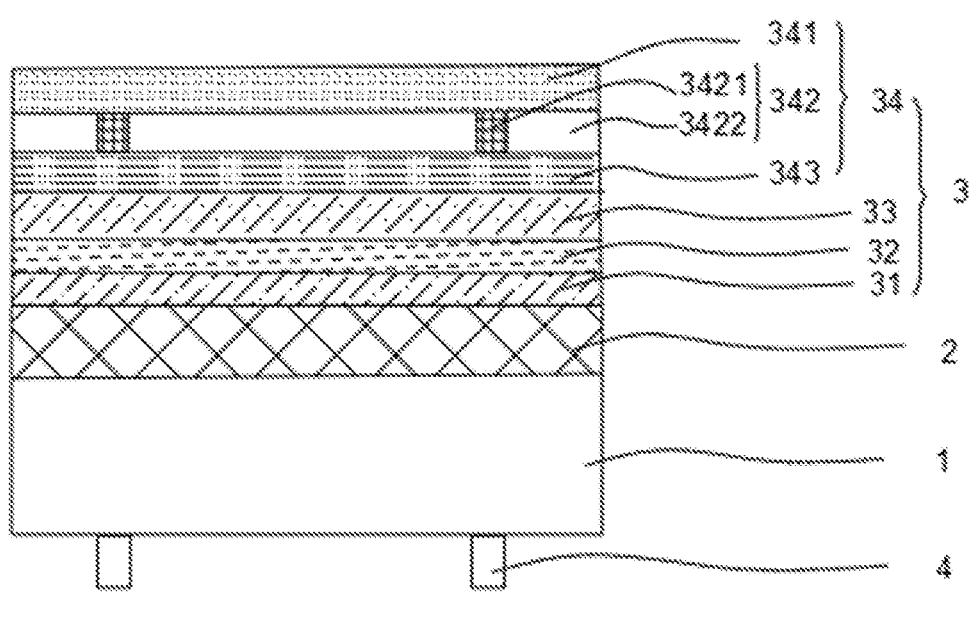
FIG. 1 is a schematic structural diagram of a solar cell according to one or more embodiments of the present disclosure.

In the drawings, 1: bottom cell;

2: inter layer;

3: perovskite top cell;

31: hole transport layer;

32: perovskite layer;

33: electron transport layer;

34: conductive structure;

341: first conductive layer;

342: second conductive layer;

3421: metal conductive film;

3422: second transparent conductive film;

343: third conductive layer;

4: back electrode;

5: front electrode;

1000: photovoltaic module;

100: solar cell;

200: first cover plate;

300: first encapsulation adhesive layer;

400: second encapsulation adhesive layer;

500: second cover plate.

DESCRIPTION OF EMBODIMENTS

In order to better understand the technical solutions of the present disclosure, embodiments of the present disclosure are described in detail below with reference to the accompanying drawings.

It is to be made clear that the described embodiments are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after it are in an "or" relationship.

In most of conventional silicon-perovskite tandem solar cells, a transparent conductive layer is a thin film made of Indium Tin Oxide (ITO), Indium-Zinc-Oxide (IZO), Transparent Conductive Oxide (TCO), and the like, so conductivity of the transparent conductive layer is poor. In order to improve conductivity of the solar cell, there is a need to deposit a metal electrode on a surface of the transparent conductive layer to improve the conductivity. However, electrodes (generally made of gold, silver, and the like) are relatively expensive, which increases the cost of the solar cell.

Therefore, embodiments of the present disclosure provide a solar cell 100. The solar cell 100 has high conductivity and a low cost.

FIG. 1 is a schematic structural diagram of a solar cell 100 according to the present disclosure. As shown in FIG. 1, the solar cell 100 includes a bottom cell 1, an inter layer 2, a perovskite top cell 3, and a back electrode 4.

The bottom cell 1 includes a front surface and a back surface opposite to each other.

The inter layer 2 and the perovskite top cell 3 are located on the front surface of the bottom cell 1. The perovskite top cell 3 includes a hole transport layer 31, a perovskite layer 32, an electron transport layer 33, and a conductive structure 34 stacked on a surface of the inter layer 2. The conductive structure 34 includes at least one stack, each stack includes a first conductive layer 341 and a second conductive layer 342 stacked with the first conductive layer 341, and the second conductive layer 342 is located between the first conductive layer 341 and the electron transport layer 33. The first conductive layer 341 includes a first transparent conductive film. The second conductive layer 342 includes a metal conductive film 3421 in a metallization region and a second transparent conductive film 3422 in a non-metallization region. As shown in FIG. 1, the second conductive layer 342 includes a metallization region and a non-metallization region, the metal conductive film 3421 is arranged in the metallization region, and the second transparent conductive film 3422 is arranged in the non-metallization region. As shown in FIG. 1, the metal conductive film 3421 and the second transparent conductive film 3422 are arranged in different regions of the second conductive layer 342.

The back electrode 4 is located on the back surface of the bottom cell 1.

In the solar cell provided by embodiments of in the present disclosure, the metal conductive film 3421 corresponding to the metallization region in the conductive structure improves the conductivity of the conductive structure 34, so that the solar cell 100 has a higher conductivity without being provided with the front electrode 5, and charge collection efficiency of a tandem cell is improved, thereby improving conversion efficiency of the solar cell. In addition, the second conductive layer 342 is located between the first conductive layer 341 and the electron transport layer 33, that is, the first conductive layer 341 is at the outermost layer of the solar cell, which can protect the metal conductive film 3421 and prevent the metal conductive film 3421 from being affected by the outside.

In the present disclosure, the metal conductive film 3421 is arranged in the metallization region of the conductive structure. Compared with the arrangement that a metal layer is arranged on the entire surface, the metal conductive film 3421 can improve the conductivity of the conductive structure without affecting absorption of sunlight by the solar cell, thereby improving photoelectric conversion efficiency of the solar cell.

In some embodiments of the present disclosure, the solar cell 100 does not include the front electrode 5, the metallization region refers to a region in the second conductive layer 342 corresponding to the back electrode 4, and the non-metallization region refers to a region in the second conductive layer 342 other than metallization region. For example, the metallization region overlaps the back electrode 4 in a plan view.

A type of the bottom cell 1 is not limited in the present disclosure. The bottom cell 1 is a silicon solar cell. For example, the bottom cell 1 may be a heterojunction cell (HIJ cell), a passivated emitter and rear contact (PERC) cell, a passivated emitter rear totally diffused (PERT) cell, a tunnel oxide passivated contact (TOPCon) cell, or the like.

For example, when the bottom cell 1 is the HIJ cell, the HIJ cell includes a crystalline silicon substrate, and the crystalline silicon substrate has a front surface and a back surface opposite to each other. The front surface of the crystalline silicon substrate is sequentially provided with an intrinsic hydrogenated amorphous silicon layer, a P-type hydrogenated amorphous silicon layer, and a front transparent conductive layer. The inter layer is located on a surface of the front transparent conductive layer. The back surface of the crystalline silicon substrate is provided with an intrinsic hydrogenated amorphous silicon layer, an n-type hydrogenated amorphous silicon layer, and a back transparent conductive layer. The back electrode 4 is located on the surface of the back transparent conductive layer. The front surface of the crystalline silicon substrate refers to a surface facing the sunlight, and a back surface of the semiconductor substrate refers to a surface facing away from the sunlight.

For example, when the bottom cell 1 is the PERT cell, the PERT cell includes a first passivation layer, a second passivation layer, an n-type silicon substrate, a p-type doped emitter, a tunneling layer, and a doped polysilicon layer arranged in sequence from bottom to top. The back electrode

4 may include finger lines and busbar lines, and the finger lines of the back electrode 4 are embedded in and penetrate through the first passivation layer and the second passivation layer, and are in contact with the n-type silicon substrate. The P-type doped emitter, the tunneling layer, and the doped polysilicon layer form a tunnel junction. The first passivation layer includes a silicon nitride layer, a silicon oxide layer, or a stacked structure of silicon nitride and silicon oxide. The second passivation layer includes a phosphorous diffusion layer. The tunneling layer includes at least one of a silicon oxide layer, an aluminum oxide layer, and a silicon carbide layer. The doped polysilicon layer may be formed by doping a polycrystalline and then performing a high-temperature treatment on the polycrystalline.

For example, when the bottom cell is the TOPCon cell, the TOPCon cell includes a passivation layer, an n-type silicon substrate, a tunneling layer, and a doped polysilicon layer arranged in sequence from bottom to top. The back electrode 4 is embedded in the passivation layer, penetrates through the passivation layer, and is in contact with the n-type silicon substrate. The doped polysilicon layer is in contact with the inter layer. The passivation layer includes a silicon nitride layer, a silicon oxide layer, or a stacked structure formed by silicon nitride and silicon oxide. The tunneling layer includes at least one of a silicon oxide layer, an aluminum oxide layer, and a silicon carbide layer. The doped polysilicon layer may be formed by doping a polycrystalline and then performing a high-temperature treatment on the polycrystalline. The tunneling layer and the doped polysilicon layer jointly form a passivated contact structure.

In the present disclosure, the inter layer 2 includes a tunnel junction or a transparent conductive layer. Photo-induced electrons generated by the perovskite top cell 3 and photo-induced holes generated by the bottom cell 1 are recombined in the tunnel junction. For example, the transparent conductive layer may be made of TCOs, indium-doped zinc oxide (IZO), ITO, transparent electrode Ag, or the like. The inter layer 2 has a good light transmitting property and a good conductivity. The inter layer 2 connects the bottom cell 1 and the perovskite top cell 3 to achieve ohmic contact, thereby ensuring recombination of the electrons and the holes inside the cell and improving bandgap matching between the bottom cell 1 and the top cell.

In some embodiments, a material of the metal conductive film 3421 includes at least one of Ni, Cu, Al, Ni, Sn, Zn, Ag, and Au. The conductivity of the metal conductive film 3421 made of the above material is greater than that of the transparent conductive film (generally made of ITO, IZO, or TCO), and lateral transport of electrons in the conductive structure 34 can be improved, so that the conductivity of the conductive structure 34 is improved. In this way, the series resistance of the solar cell is reduced, charge transport capability is improved, the short-circuit current density of the solar cell 100 is increased, and a fill factor is increased, thereby effectively improving photoelectric conversion efficiency of the solar cell 100. In some embodiments, the material of the metal conductive film 3421 includes at least one of Ni, Cu, Al, Sn, and Zn. The above materials are unstable in nature, but have lower costs. Since a surface of the metal conductive film 3421 is covered by the first transparent conductive film, the Ni, Cu, Al, Sn, and Zn that are unstable in nature can still exhibit a higher conductivity.

Figure 2:
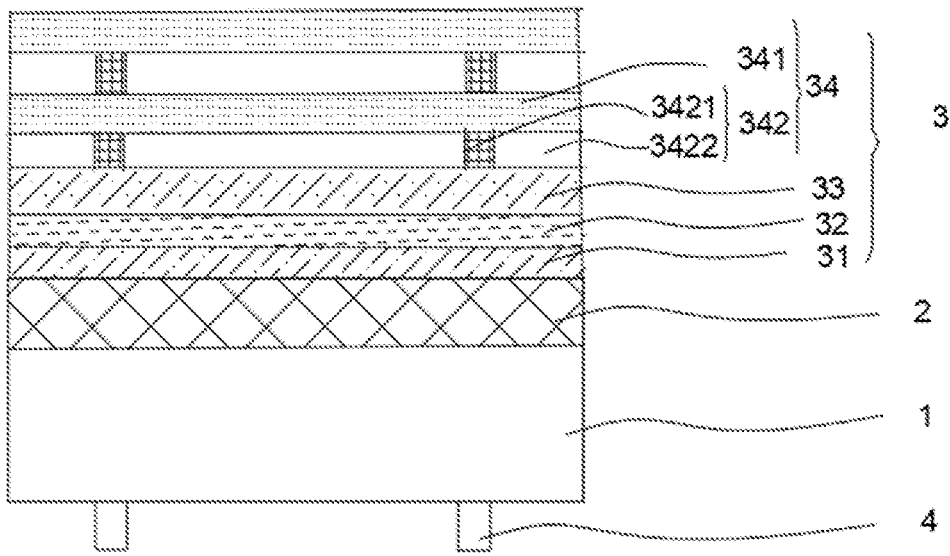
FIG. 2 is a schematic structural diagram of a solar cell including a conductive structure including two stacks according to one or more embodiments of the present disclosure.

In some embodiments, the conductive structure 34 includes at least one stack, and each stack includes the first conductive layer 341 and the second conductive layer 342 stacked together. That is, the first conductive layer 341 and the second conductive layer 342 constitute a multi-layer structure, and the conductive structure 34 may include one multi-layer structure, two stacked multi-layer structures, three stacked multi-layer structures, four stacked multi-layer structures, or the like. A number of multi-layer structures (each including the first conductive layer 341 and the second conductive layer 342) in the conductive structure 34 is not limited in embodiments of the present disclosure, which may be designed according to a conductivity requirement of the solar cell 100. FIG. 1 shows a solar cell 100 including a conductive structure 34 including one multi-layer structure, one layer of the multi-layer structure is a first transparent conductive layer, and the other layer of the multi-layer structure is the second conductive layer 342. The first transparent conductive layer is the outermost layer of the solar cell 100. FIG. 2 shows a solar cell 100 including a conductive structure 34 including two multi-layer structures. The conductive structure 34 includes two first conductive layers 341 and two second conductive layers 342. When the conductive structure 34 of the solar cell 100 includes two or more stacks each constituted by the first conductive layer 341 and the second conductive layer 342, the metal conductive films 3421 in different stacks may be made of a same material or different materials. In some embodiments, the metal conductive films 3421 in different stacks are made of different materials, instability of the metal conductive film 3421 away from the electron transport layer 33 is less than that of the metal conductive film 3421 close to the electron transport layer 33, thereby improving electrical properties of the solar cell. For example, a metal conductive film 3421 adjacent to the electron transport layer 33 is a Cu layer, and another conductive film 3421 away from the electron transport layer 33 is an Al layer.

In some embodiments, a thickness of the metal conductive film 3421 ranges from 0.1 nm to 10 nm. For example, the thickness of the metal conductive film 3421 is 0.1 nm, 0.5 nm, 1 nm, 2 nm, 3 nm, 4 nm, 5 nm, 6 nm, 7 nm, 8 nm, 9 nm, or 10 nm. In some embodiments, the thickness of the metal conductive film 3421 is a thickness of the second conductive layer 342.

In some embodiments, a thickness of the conductive structure 34 ranges from 20 nm to 200 nm. For example, the thickness of the conductive structure 34 may be 20 nm, 30 nm, 40 nm, 50 nm, 60 nm, 70 nm, 80 nm, 100 nm, 120 nm, 150 nm, 180 nm, or 200 nm. The thickness of the conductive structure 34 of the present disclosure is substantially equal to the thickness of the transparent conductive layer of the conventional silicon-perovskite tandem cell. That is, the conductivity of the solar cell can be improved without changing the thickness of the conductive layer. In some embodiments, the thickness of the conductive structure 34 ranges from 50 nm to 150 nm.

In some embodiments, the conductive structure 34 further includes a third conductive layer 343, the third conductive layer 343 is located between the second conductive layer 342 and the electron transport layer 33, and the third conductive layer 343 includes a third transparent conductive film. That is, in the conductive structure 34 of the solar cell 100 in the present disclosure, two surfaces of the second conductive layer 342 are each provided with a transparent conductive layer.

In some embodiments, the thickness of the second conductive layer 342 is greater than that of the first conductive layer 341, and the second conductive layer 342 includes the metal conductive film 3421. In the present disclosure, the thickness of the second conductive layer 342 is greater than that of the first conductive layer 341, the conductivity of the conductive structure 34 can be further improved, and efficiency of carrier collection can be improved.

In some embodiments, the solar cell 100 further includes a front electrode 5 located on the front surface of the conductive structure. The front surface of the conductive structure 34 is a surface of the outermost first conductive layer 341 in the conductive structure 34. Through the cooperation of the metal conductive film 3421 in the metallization region and the front electrode 5, the conductivity of the solar cell 100 can be further improved.

It may be understood that, when the solar cell 100 includes the front electrode 5, the metal conductive film 3421 may correspond to a position of the front electrode 5 or correspond to a position of the back electrode 4. In some embodiments, to enable the solar cell 100 to absorb more sunlight, the metal conductive film 3421 may correspond to the position of the front electrode 5.

In some embodiments, a material of the front electrode 5 includes at least one of Ag and Au.

In some embodiments, a material of the back electrode 4 includes at least one of Ag and Au.

Figure 14:
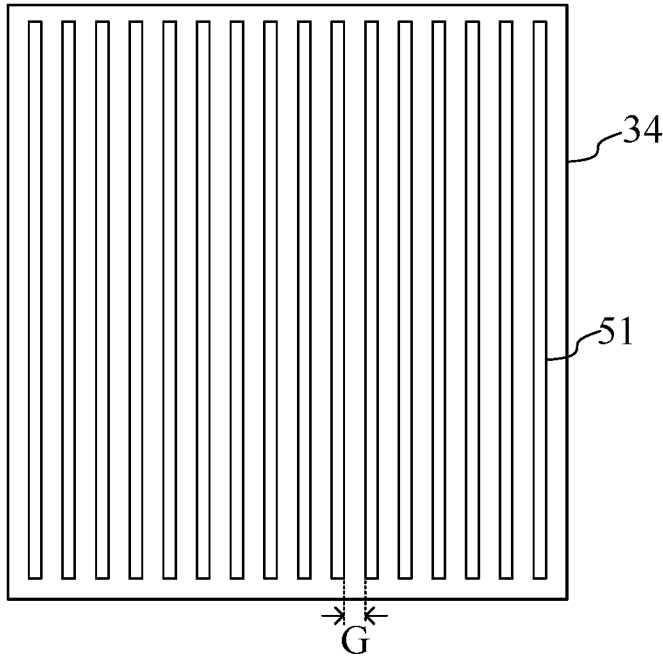
FIG. 14 is a plan view of a front electrode.

In some embodiments, when the solar cell 100 of the present disclosure includes the front electrode 5, the amount of the material used for forming the front electrode 5 may be reduced due to the presence of the conductive structure 34. As shown in FIG. 14, the front electrode 5 includes finger lines 51 extending in parallel, a gap G between adjacent finger lines of the finger lines of the front electrode 5 may be increased (expanded), so as to ensure the conductivity of the solar cell and reduce manufacturing costs.

In some embodiments, the finger lines 51 each extend in a longitudinal direction, and the gap G of the finger lines 51 of the front electrode 5 ranges from 1 mm to 4 mm. For example, the gap G of the finger lines 51 of the front electrode 5 is 1 mm, 1.5 mm, 2 mm, 2.5 mm, 3 mm, 3.5 mm, or 4 mm. In some embodiments, the finger lines 51 each extend in a transverse direction, and the gap G of the finger lines 51 of the front electrode 5 ranges from 1 mm to 4 mm. For example, the gap G of the finger lines 51 of the front electrode 5 is 1 mm, 1.5 mm, 2 mm, 2.5 mm, 3 mm, 3.5 mm, or 4 mm. Whereas, the gap G of adjacent finger lines of a conventional silicon-perovskite cell generally ranges from 0.5 mm to 2 mm. The gap G of the finger lines 51 of the front electrode 5 in the present disclosure is greater than that of a conventional tandem solar cell respectively, which can reduce the number of lines of the front electrode and save the cost without affecting the conductivity of the solar cell.

In some embodiments, the front electrode 5 includes first finger lines 51 and second finger lines (not shown in FIG. 14). The first finger lines 51 extend in parallel along a first direction, and the second finger lines extend in parallel along a second direction crossing the first direction. For example, the second direction is perpendicular to the first direction. The gap between adjacent first finger lines 51 ranges from 1 mm to 4 mm. The gap between adjacent second finger lines is greater than the gap between adjacent first finger lines 51.

In some embodiments, a ratio of a height of the front electrode 5 to a height of the back electrode 4 is greater than or equal to 0.1. For example, the ratio of the height of the front electrode 5 to the height of the back electrode 4 may be 0.1, 0.15, 0.20, 0.25, 0.30, 0.50, or 0.70. It may be understood that the height of the back electrode 4 in the present disclosure is the same as heights of the back electrode 4 and the front electrode 5 in the conventional silicon-perovskite tandem cell. In the present disclosure, the material amount used for forming the front electrode 5 may be reduced by arranging the conductive structure 34. For example, the height of the front electrode 5 may be reduced, so as to ensure the conductivity of the solar cell and reduce manufacturing costs. In some embodiments, the ratio of the height of the front electrode 5 to the height of the back electrode 4 ranges from 0.10 to 0.30.

The present disclosure further provides a method for manufacturing the above solar cell 100. As shown in FIG. 3, the method includes the following steps.

A bottom cell 1 is provided. The bottom cell 1 includes a front surface and a back surface opposite to each other.

An inter layer 2 and a perovskite top cell 3 are formed on the front surface of the bottom cell 1. The perovskite top cell 3 includes a hole transport layer 31, a perovskite layer 32, an electron transport layer 33, and a conductive structure 34 stacked on a surface of the composite layer 2. The conductive structure 34 includes at least one stack. Each stack includes a first conductive layer 341 and a second conductive layer 342 stacked together, and the second conductive layer 342 is located between the first conductive layer 341 and the electron transport layer 33. The first conductive layer 341 includes a first transparent conductive film, and the second conductive layer 342 includes a metal conductive film 3421 corresponding to a metallization region and a second transparent conductive film 3422 corresponding to a non-metallization region.

A back electrode 4 is formed on the back surface of the bottom cell 1.

According to embodiments of the present disclosure, the conductive structure 34 is formed on a surface of the electron transport layer 33, and the conductive structure 34 includes the first conductive layer 341 and the second conductive layer 342 stacked together. The second conductive layer 342 includes the metal conductive film 3421 corresponding to the metallization region and the second transparent conductive film 3422 corresponding to the non-metallization region. Due to the existence of the metal conductive film 3421, conductivity of the conductive structure 34 can be improved, so that the solar cell 100 can obtain a higher conductivity without being provided with the front electrode 5, thereby improving charge collection efficiency of the tandem cell and finally improving conversion efficiency of the tandem cell. In addition, in the present disclosure, the second conductive layer 342 is located between the first conductive layer 341 and the electron transport layer 33. The outermost layer of the tandem solar cell is a first conductive layer 341. In this way, the metal conductive film 3421 is protected, and the metal conductive film 3421 is prevented from being affected by the outside.

In the present disclosure, the metal conductive film 3421 is arranged in the metallization region of the conductive structure. Compared with a metal layer arranged on the entire surface, the present disclosure can improve the conductivity of the conductive structure without affecting absorption of sunlight by the solar cell, thereby improving photoelectric conversion efficiency of the solar cell.

It may be understood that the solar cell 100 of the present disclosure is a tandem cell composed of a silicon cell and a perovskite solar cell 100. Any modification, equivalent replacement, improvement, and the like made by any person skilled in the art without departing from the concept of the present disclosure shall be included within the protection scope of the present disclosure.

Figure 11:
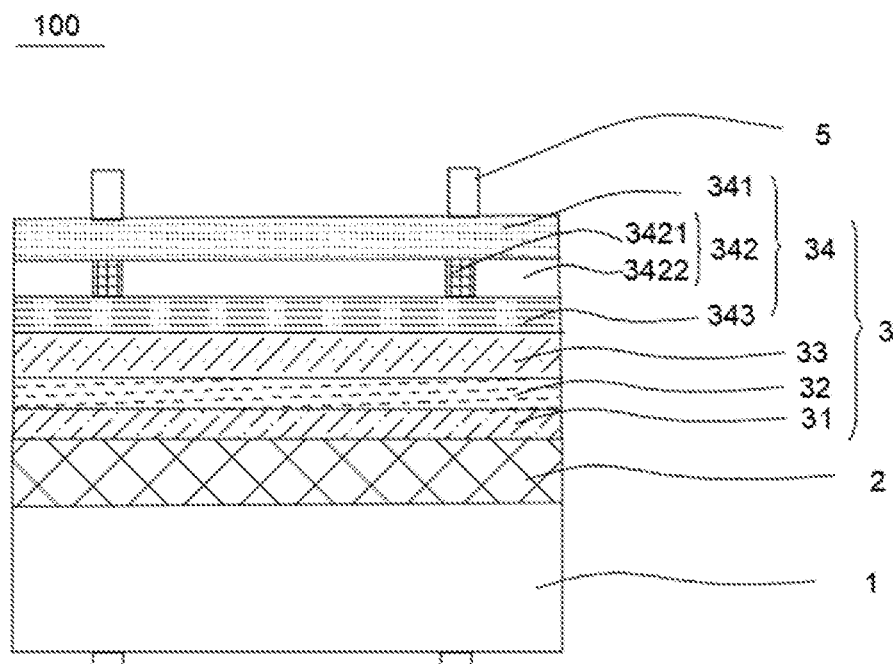
FIG. 11 is a schematic structural diagram of a solar cell including the front electrode according to one or more embodiments of the present disclosure.

The manufacturing method of the present disclosure is described below according to specific embodiments. The manufacturing method includes steps shown in FIG. 3. Intermediate structures formed in various steps of the manufacturing method are shown in FIG. 11.

Figure 4:
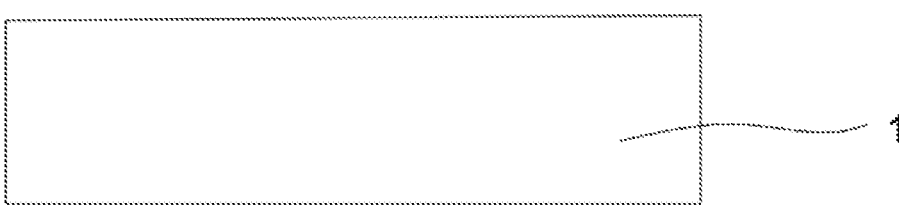
FIG. 4 is a schematic structural diagram of a bottom cell according to one or more embodiments of the present disclosure.

In step S100, a bottom cell 1 is provided. The bottom cell 1 includes a front surface and a back surface opposite to each other. A structure of the bottom cell 1 is as shown in FIG. 4.

A type and a manufacturing method of the bottom cell 1 are not limited in the present disclosure. For example, the bottom cell 1 may be a HIJ cell, a p-type cell (PERC cell), a TOPCon cell, or the like.

Figure 5:
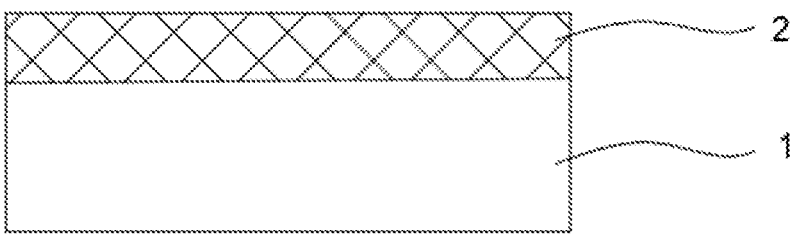
FIG. 5 is a schematic structural diagram of the bottom cell and an inter layer according to one or more embodiments of the present disclosure.

In step S200, an inter layer 2 is formed on the front surface of the bottom cell 1, and a structure shown in FIG. 5 is obtained.

In this step, the inter layer 2 includes a tunnel junction or a transparent conductive layer. Photo-induced electrons generated by the perovskite top cell 3 and photo-induced holes generated by the bottom cell 1 are recombined in the tunnel junction. For example, the transparent conductive layer may be made of TCOs, IZO, ITO, transparent electrode Ag, or the like. The inter layer 2 has a good light transmitting property and a good conductivity. The inter layer 2 connects the bottom cell 1 and the perovskite top cell 3 to achieve ohmic contact, thereby ensuring recombination of the electrons and the holes inside the cell and improving bandgap matching between the bottom cell 1 and the top cell.

In step S300, a perovskite top cell 3 is formed on a surface of the inter layer 2.

Figure 6:
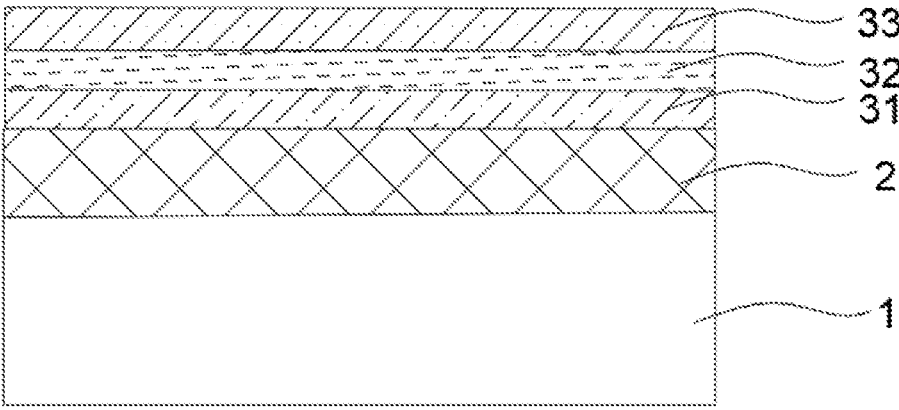
FIG. 6 is a schematic structural diagram of a hole transport layer, a perovskite layer, and an electron transport layer formed on a surface of the inter layer according to one or more embodiments of the present disclosure.
Figure 13:
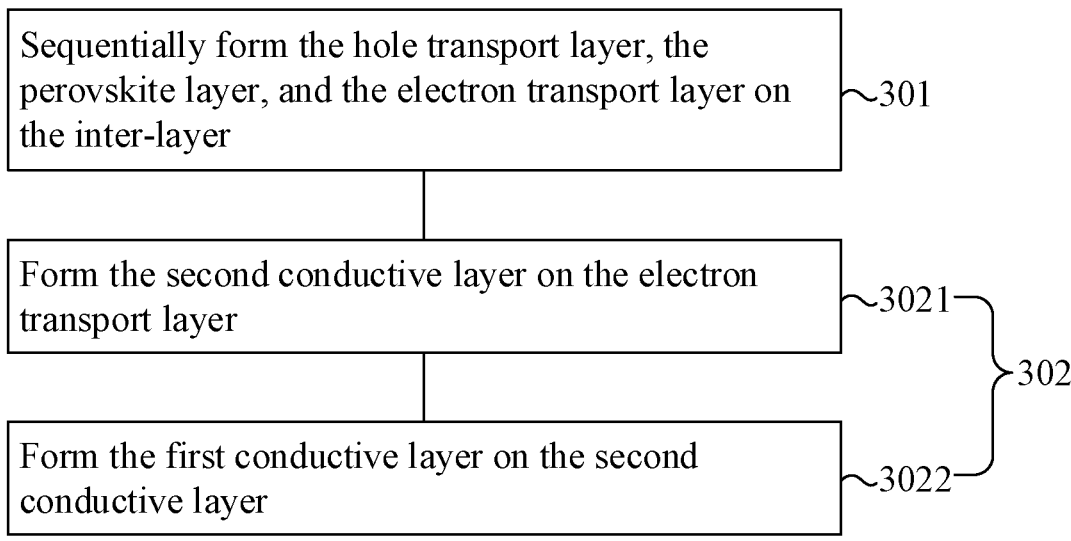
FIG. 13 is a flowchart of a method for forming a perovskite top cell on a bottom cell according to one or more embodiments of the present disclosure.

In some embodiments, the perovskite top cell 3 is formed according to the method shown in FIG. 13. As shown in FIG. 13, in step S301, a hole transport layer 31, a perovskite layer 32, and an electron transport layer 33 are formed in sequence on the surface of the inter layer 2, and a structure shown in FIG. 6 is obtained.

In some embodiments, the hole transport layer 31 refers to a layer that extracts and transports photo-induced holes generated in the perovskite layer 32, including, but not limited to, an organic material and an inorganic material. For example, the organic material includes at least one of 2,2',7,7'-tetra[N,N-bis(4-methoxyphenyl)amino]-9,9'-spiro-bifluorene (spiro-OMe TAD), poly[bis(4-phenyl)(2,4,6-trimethylphenyl)amine] (PTAA), and poly3-hexylthiophene (P3HT). The inorganic material includes at least one of CuI, CuSCN, $TiO_2$, and $SnO_2$.

In some embodiments, a thickness of the hole transport layer 31 ranges from 1 nm to 200 nm. The thickness of the hole transport layer 31 may be, for example, 1 nm, 5 nm, 10 nm, 20 nm, 50 nm, 80 nm, 100 nm, 120 nm, 156 nm, 170 nm, 180 nm, 195 nm, 200 nm, or the like. If the thickness of the hole transport layer 31 is within the above range, it is conducive to improving an open-circuit voltage and a fill factor.

In some embodiments, the hole transport layer 31 is formed by at least one of magnetron sputtering, high-temperature spraying, and spin coating.

The perovskite cell refers to the solar cell including the perovskite layer 32, and perovskite in the perovskite layer 32 refers to a crystal material with a structure of $ABX_3$ and similar structures.

A is a monovalent cation, including, but not limited to, at least one of $Rb^+$, $Na^+$, $K^+$, $Cs^+$, $HN\!\!=\!\!CHNH_3^+$ (abbreviated as FA), and $CH_3NH_3^+$ (abbreviated as MA).

B is a divalent cation, including, but not limited to, at least one of $Sn^{2+}$ and $Pb^{2+}$.

X is selected from at least one of a halogen anion ($F^-$, $Cl^-$, $Br^-$, or the like), $O^{2-}$, and $S^{2-}$.

In the structure, B is located at a center of a cubic cell body, X is located at a center of a cube surface, and A is located at a vertex of a cube. The structure of the perovskite solar cell is more stable than a structure connected in a colloid or coplanar form, which is conducive to diffusion and migration of defects.

The perovskite layer 32 includes, but is not limited to, at least one of, for example, $CH_3NH_3PbI_3$, $(Cs)_x(FA)_{1-x}PbI_3$, $(FA)_x(MA)_{1-x}PbI_3$, $(FA)_x(MA)_{1-x} PbI_yCl_{1-y}$, and $(FAPbI_3)_x (MAPbBr_3)_{1-x}$, where x ranges 0 to 1 and y ranges 0 to 1.

When exposed to sunlight, the perovskite layer 32 first absorbs photons and generates electron-hole pairs. The carriers either become free carriers or form excitons according to a difference in binding energy of perovskite excitons. Moreover, the perovskite material generally has a lower carrier recombination probability and a higher carrier mobility, so the carriers have a longer diffusion distance and a longer lifetime. For example, a carrier diffusion length of $CH_3NH_3PbI_3$ is at least 100 nm. A diffusion length of $CH_3NH_3PbI_{3-x}Cl_x$ is even greater than 1 μm, where x ranges 0 to 1. The solar cell 100 including the perovskite layer 32 can obtain relatively excellent performance. In some embodiments, the perovskite layer is made of $CH_3NH_3PbI_3$.

In some embodiments, a thickness of the perovskite layer 32 ranges from 300 nm to 800 nm. The thickness of the perovskite layer 32 may be, for example, 300 nm, 350 nm, 380 nm, 420 nm, 480 nm, 500 nm, 600 nm, 630 nm, 680 nm, 700 nm, 720 nm, 750 nm, 800 nm, or the like. If the thickness of the perovskite layer 32 is within the above range, it is conducive to absorption of light and inhibiting recombinations of carriers.

In some embodiments, the perovskite layer 32 is formed by at least one of spin coating, spraying, blade coating, and evaporation.

The perovskite layer 32 according to the present disclosure is inexpensive and can be manufactured using a solution, making it easier to manufacture than conventional silicon solar cells by using a roll-to-roll technology that does not require vacuum conditions.

The electron transport layer 33 (ETM) refers to a layer that extracts and transports photo-induced electrons generated in the perovskite layer 32, including, but not limited to, an inorganic material or a polymer material. For example, the inorganic material includes at least one of ZnO and $MoO_3$. The polymer material includes at least one of a fullerene derivative (PCBM) and C60.

In some embodiments, a thickness of the electron transport layer 33 ranges from 10 nm to 50 nm. The thickness of the electron transport layer 33 may be, for example, 10 nm, 15 nm, 20 nm, 25 nm, 30 nm, 35 nm, 40 nm, 45 nm, 50 nm, or the like. If the thickness of the electron transport layer 33 is controlled within the above range, it is conducive to electron transport.

In some embodiments, the electron transport layer 33 is formed by at least one of spraying, blade coating, evaporation, and spin coating.

It may be understood that the hole transport layer 31, the perovskite layer 32, and the electron transport layer 33 may be manufactured by a same method or by different methods.

In step S302, a conductive structure is formed on a surface of the electron transport layer 33.

Figure 7:
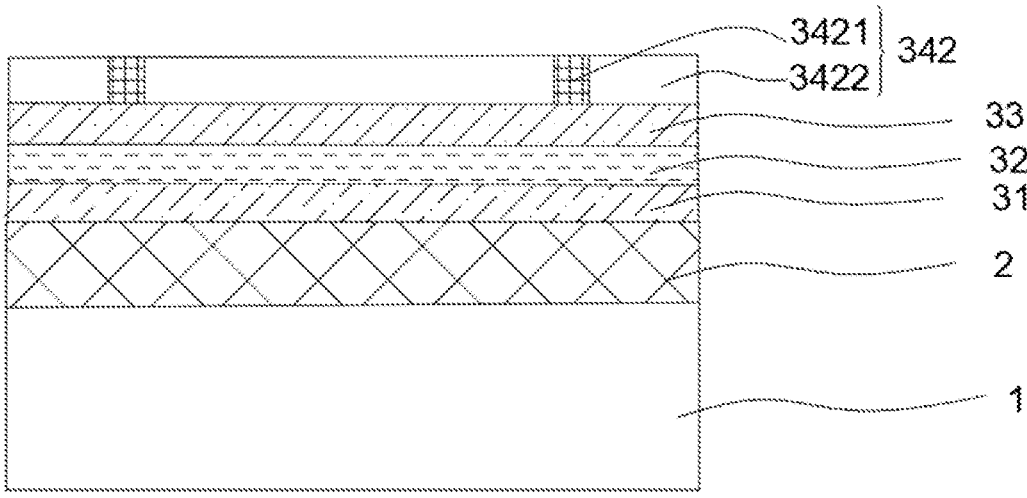
FIG. 7 is a schematic structural diagram of a conductive structure formed on a surface of the electron transport layer according to one or more embodiments of the present disclosure.

In some embodiments, step S302 includes step S3021 and step S3022. In step S3021, a second conductive layer 342 is formed on the surface of the electron transport layer 33. As shown in FIG. 7, the second conductive layer 342 includes a metal conductive film 3421 corresponding to a metallization region and a second transparent conductive film corresponding to a non-metallization region.

Figure 8:
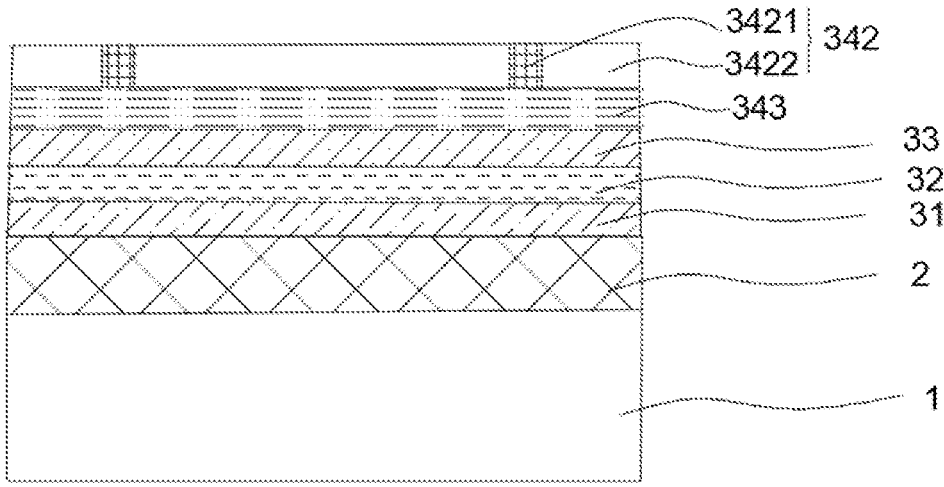
FIG. 8 is a schematic structural diagram of a conductive structure including a second conductive layer and a third transparent conductive layer according to one or more embodiments of the present disclosure.

In some embodiments, before the second conductive layer 342 is formed on the surface of the electron transport layer 33, a third conductive layer 343 is formed on the surface of the electron transport layer 33 first, and then the second conductive layer 342 is formed on a surface of the third conductive layer 343, and a structure shown in FIG. 8 is obtained.

In some embodiments, the third conductive layer 343 includes a transparent conductive film, and the transparent conductive film includes at least one of an ITO film, an IZO film, and a TCO film.

In some embodiments, the third conductive layer 343 is manufactured by a physical vapor deposition process. For example, the physical vapor deposition process includes at least one of magnetron sputtering, thermal evaporation, and electron beam physical deposition.

In some embodiments, the metal conductive film 3421 corresponding to the metallization region and the second transparent conductive film 3422 corresponding to the non-metallization region may be formed using a screen printing process combined with a sintering process. In some other embodiments, a physical vapor deposition process may be adopted. For example, the physical vapor deposition process includes at least one of magnetron sputtering, thermal evaporation, and electron beam physical deposition.

In some embodiments, the metal conductive film 3421 is formed using at least one of an Ni source, a Cu source, an Al source, an Sn source, a Zn source, an Ag source, and an Au source. The conductivity of the metal conductive film 3421 made of the above material is greater than that of the transparent conductive film (generally made of ITO, IZO, or TCO), and the price is low, so that the conductivity of the conductive structure 34 is improved and the cost is reduced, thereby reducing series resistance of the solar cell and improving charge transport capability, which can not only increase short-circuit current density of the solar cell 100, but also increase a fill factor, thereby effectively improving photoelectric conversion efficiency of the solar cell 100.

In some embodiments, a thickness of the metal conductive film 3421 ranges from 0.1 nm to 10 nm. For example, the thickness of the metal conductive film 3421 is 0.1 nm, 0.5 nm, 1 nm, 2 nm, 3 nm, 4 nm, 5 nm, 6 nm, 7 nm, 8 nm, 9 nm, or 10 nm. In some embodiments, the thickness of the metal conductive film 3421 is a thickness of the second conductive layer 342.

In some embodiments, the metal conductive film 3421 corresponding to the metallization region and the second transparent conductive film corresponding to the non-metallization region may be formed using an etching process. That is, firstly, a transparent conductive film is formed on the surface of the electron transport layer 33, then the transparent conductive film is removed by etching in the metallization region of the transparent conductive film, and then the metal conductive film 3421 is formed by a deposition process or a screen printing process.

In some embodiments, the second transparent conductive film 3422 includes at least one of an ITO film, an IZO film, and a TCO film.

Figure 9:
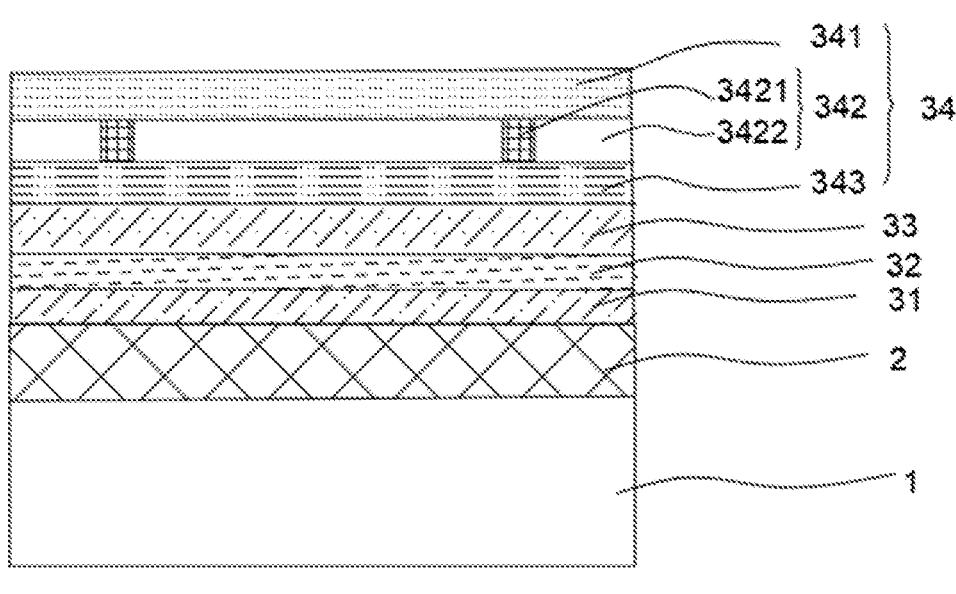
FIG. 9 is a schematic structural diagram of a conductive structure including a first conductive layer, a second conductive layer, and a third transparent conductive layer according to one or more embodiments of the present disclosure.

In step S3022, a first conductive layer 341 is formed on a surface of the second conductive layer 342, to obtain a structure as shown in FIG. 9.

In some embodiments, the first conductive layer 341 is formed by at least one of a sputtering process and a deposition process.

In some embodiments, the first conductive layer 341 (i.e., the first transparent conductive film) includes at least one of an ITO film, an IZO film, and a TCO film. It may be understood that materials of the first transparent conductive film and the second transparent conductive film 3422 may be the same or different.

In some embodiments, when the number of the stack including first conductive layer 341 and the second conductive layer 342 is greater than or equal to 2, step S3021 and step S3022 are repeated.

Figure 10:
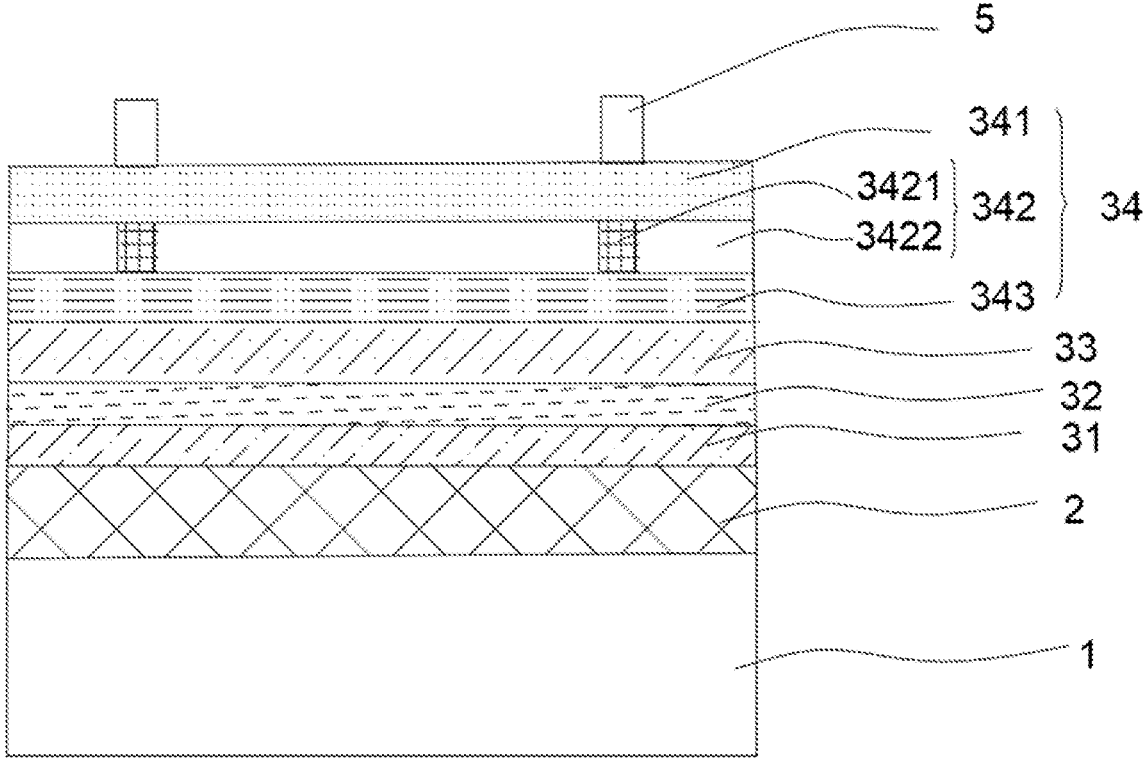
FIG. 10 is a schematic structural diagram of a front electrode formed on a surface of an outermost first conductive layer according to one or more embodiments of the present disclosure.

In some embodiments, the solar cell 100 of the present disclosure further includes: step S500 of forming a front electrode 5 on a surface of the conductive structure, and a structure shown in FIG. 10 is obtained. The front surface of the conductive structure 34 may be a surface of the outermost first conductive layer 341 in the conductive structure 34.

In some embodiments, a material of the front electrode 5 includes at least one of Ag and Au.

In some embodiments, the front electrode 5 is manufactured by at least one of vacuum evaporation, electron beam deposition, electroplating, and screen printing.

In some embodiments, a gap of the finger lines of the front electrode 5 ranges from 1 mm to 4 mm. For example, the gap of the finger lines of the front electrode 5 is 1 mm, 1.5 mm, 2 mm, 2.5 mm, 3 mm, 3.5 mm, or 4 mm, and a gap of the finger lines of a conventional silicon-perovskite cell generally ranges from 0.5 mm to 2 mm. The gap of the finger lines of the front electrode 5 in the present disclosure is greater than that of a conventional tandem solar cell, which can save the amount of the material for forming the front electrode and save the cost without affecting the conductivity of the solar cell.

In some embodiments, a ratio of a height of the front electrode 5 to a height of the back electrode 4 is greater than or equal to 10%. For example, the ratio of the height of the front electrode 5 to the height of the back electrode 4 may be 10%, 15%, 20%, 25%, 30%, 50%, or 70%. If the height of the front electrode 5 is within the above range, it indicates that an amount of the material for forming the front electrode 5 of the present disclosure is reduced, thereby ensuring the conductivity of the solar cell and reducing manufacturing costs. In some embodiments, the ratio of the height of the front electrode 5 to the height of the back electrode 4 ranges from 10% to 30%.

In step S400, a back electrode 4 is formed on the back surface of the bottom cell 1, and the solar cell 100 is obtained.

It may be understood that the front electrode 5 may be optionally formed in the present disclosure. That is, a solar cell 100, as shown in FIG. 1, not including the front electrode 5 but only including the back electrode 4 may be manufactured in the present disclosure. In some other embodiments, a solar cell, as shown in FIG. 11, including both the front electrode 5 and the back electrode 4 may be manufactured in the present disclosure.

In some embodiments, a material of the back electrode 4 includes at least one of Ag and Au.

In some embodiments, the back electrode 4 is formed by at least one of vacuum evaporation, electron beam deposition, electroplating, and screen printing.

In some embodiments, a gap of the finger lines of the back electrode 4 ranges from 0.2 μm to 3 μm. For example, the gap of the finger lines of the back electrode 4 may be 0.2 μm, 0.5 μm, 1 μm, 2 μm, or 3 μm.

In some embodiments, a height of the back electrode ranges from 20 nm to 70 nm. For example, the height of the back electrode may be 20 nm, 30 nm, 40 nm, 50 nm, 60 nm, or 70 nm.

Embodiments of the present disclosure provide a photovoltaic module 1000. The photovoltaic module 1000 includes a solar cell string. The solar cell string includes a plurality of solar cells electrically connected to each other. The solar cell is the tandem solar cell including a silicon bottom cell and a perovskite top cell as descried in any above embodiment.

Figure 12:
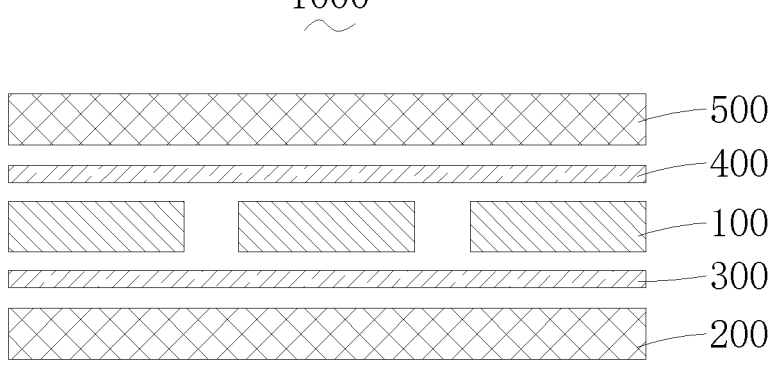
FIG. 12 is a schematic structural diagram of a photovoltaic module according to one or more embodiments of the present disclosure.

For example, referring to FIG. 12, the photovoltaic module 1000 includes a first cover plate 200, a first encapsulation adhesive layer 300, a solar cell string, a second encapsulation adhesive layer 400, and a second cover plate 500.

In some embodiments, the solar cell string includes a plurality of solar cells 100 as described above that are connected by conductive leads. The solar cells 100 may be connected by partial stack or by splicing.

In some embodiments, the first cover plate 200 and the second cover plate 500 may be transparent or opaque cover plates, such as glass cover plates or plastic cover plates.

Two sides of the first encapsulation adhesive layer 300 are in contact with and attached to the first cover plate 200 and the solar cell string respectively, and two sides of the second encapsulation adhesive layer 400 are in contact with and attached to the second cover plate 500 and the solar cell string respectively. The first encapsulation adhesive layer 300 and the second encapsulation adhesive layer 400 each may be an ethylene-vinyl acetate copolymer (EVA) adhesive film, a polyethylene octene co-elastomer (POE) adhesive film or a polyethylene terephthalate (PET) adhesive film.

Side edges of the photovoltaic module 1000 may also be completely encapsulated. That is, the side edges of the photovoltaic module 1000 are fully encapsulated with an encapsulation adhesive tape to prevent position deviation during the lamination of the photovoltaic module 1000.

The photovoltaic module 1000 further includes an edge sealing member. The edge sealing member is fixedly packaged to a partial edge of the photovoltaic module 1000. The edge sealing member may be fixedly packaged to an edge near a corner of the photovoltaic module 1000. The edge sealing member may be a high-temperature resistant tape. The high-temperature resistant tape has excellent high-temperature resistance and may not decompose or fall off during the lamination, which can ensure the reliable packaging of the photovoltaic module 1000. Two ends of the high-temperature resistant tape are fixed to the second cover plate 500 and the first cover plate 200 respectively. The two ends of the high-temperature resistant tape may be bonded to the second cover plate 500 and the first cover plate 200 respectively, and the middle thereof can limit a side edge of the photovoltaic module 1000 to prevent a lamination deviation of the photovoltaic module 1000 during the lamination.

The above are merely preferred embodiments of the present disclosure, and are not intended to limit the present disclosure. For those skilled in the art, the present disclosure may be subject to various modifications and changes. Any modification, equivalent replacement, improvement and the like within the spirit and principle of the present disclosure all fall within the protection scope of the present disclosure.

What is claimed is:

1. A solar cell comprising:
   a bottom cell, comprising a front surface and a back surface opposite to each other;
   a perovskite top cell;
   an inter layer between the front surface of the bottom cell and the perovskite top cell; and
   a back electrode located on the back surface of the bottom cell, wherein the perovskite top cell comprises a hole transport layer, a perovskite layer, an electron transport layer, and a conductive structure stacked in sequence on the inter layer, wherein the conductive structure comprises at least one stack, each stack comprises a first conductive layer and a second conductive layer, the second conductive layer is located between the first conductive layer and the electron transport layer, the first conductive layer comprises a first transparent conductive film, and the second conductive layer comprises a metal conductive film in a metallization region of the second conductive layer and a second transparent conductive film in a non-metallization region of the second conductive layer;

wherein a material of the metal conductive film comprises at least one of Ni, Cu, Al, Sn, and Zn;

wherein a thickness of the second conductive layer is greater than a thickness of the first conductive layer, wherein the solar cell further comprises a front electrode located on a surface of an outermost first conductive layer of the first conductive layer in the conductive structure, and wherein a ratio of a height of the front electrode to a height of the back electrode is greater than or equal to 0.1.

2. The solar cell according to claim 1, wherein a thickness of the metal conductive film ranges from 0.1 nm to 10 nm.

3. The solar cell according to claim 1, wherein a thickness of the conductive structure ranges from 20 nm to 200 nm.

4. The solar cell according to claim 1, wherein the conductive structure further comprises a third conductive layer located between the second conductive layer and the electron transport layer, and the third conductive layer comprises a third transparent conductive film.

5. The solar cell according to claim 1, wherein the front electrode comprises finger lines extending in parallel, and a gap between adjacent finger lines ranges from 1 mm to 4 mm.

6. A method for manufacturing a solar cell comprising:

providing a bottom cell, the bottom cell comprising a front surface and a back surface opposite to each other;

forming an inter layer on the front surface of the bottom cell;

forming a perovskite top cell on the inter layer, the perovskite top cell comprising a hole transport layer, a perovskite layer, an electron transport layer, and a conductive structure stacked on the inter layer, wherein the conductive structure comprises at least one stack, each stack comprises a first conductive layer and a second conductive layer, the second conductive layer is located between the first conductive layer and the electron transport layer, the first conductive layer comprises a first transparent conductive film, the second conductive layer comprises a metal conductive film in a metallization region and a second transparent conductive film in a non-metallization region; and forming a back electrode on the back surface of the bottom cell;

wherein a material of the metal conductive film comprises at least one of Ni, Cu, Al, Sn, and Zn;

wherein a thickness of the second conductive layer is greater than a thickness of the first conductive layer, wherein the solar cell further comprises a front electrode located on a surface of an outermost first conductive layer of the first conductive layer in the conductive structure, and wherein a ratio of a height of the front electrode to a height of the back electrode is greater than or equal to 0.1.

7. The method according to claim 6, wherein a thickness of the metal conductive film ranges from 0.1 nm to 10 nm.

8. The method according to claim 6, further comprising: forming a front electrode on a surface of an outermost first conductive layer of the first conductive layer in the conductive structure.

9. A photovoltaic module comprising a plurality of solar cell strings, and each of the solar cell strings comprising a plurality of solar cells electrically connected to each other, wherein at least one of the plurality of solar cells each comprises:

a bottom cell, comprising a front surface and a back surface opposite to each other;

a perovskite top cell;

an inter layer between the front surface of the bottom cell and the perovskite top cell; and a back electrode located on the back surface of the bottom cell, wherein the perovskite top cell comprises a hole transport layer, a perovskite layer, an electron transport layer, and a conductive structure stacked on the inter layer, wherein the conductive structure comprises at least one stack, each stack comprises a first conductive layer and a second conductive layer, the second conductive layer is located between the first conductive layer and the electron transport layer, the first conductive layer comprises a first transparent conductive film, and the second conductive layer comprises a metal conductive film in a metallization region and a second transparent conductive film in a non-metallization region;

wherein a material of the metal conductive film comprises at least one of Ni, Cu, Al, Sn, and Zn;

wherein a thickness of the second conductive layer is greater than a thickness of the first conductive layer, wherein the solar cell further comprises a front electrode located on a surface of an outermost first conductive layer of the first conductive layer in the conductive structure, and wherein a ratio of a height of the front electrode to a height of the back electrode is greater than or equal to 0.1.

10. The photovoltaic module according to claim 9, wherein a thickness of the metal conductive film ranges from 0.1 nm to 10 nm, and a thickness of the conductive structure ranges from 20 nm to 200 nm.

11. The photovoltaic module according to claim 9, wherein the conductive structure further comprises a third conductive layer located between the second conductive layer and the electron transport layer, and the third conductive layer comprises a third transparent conductive film.

12. The photovoltaic module according to claim 9, wherein each solar cell further comprises a front electrode located on a surface of an outermost first conductive layer of the first conductive layer in the conductive structure.

13. The photovoltaic module according to claim 9, wherein the front electrode comprises finger lines extending in parallel, and a pitch between adjacent finger lines ranges from 1 mm to 4 mm.

* * * * *